(12) United States Patent
Shih (10) Patent No.: US 6,529,046 B1
(45) Date of Patent: Mar. 4, 2003

(54) MINIMUM PULSE WIDTH DETECTION AND REGENERATION CIRCUIT

(75) Inventor: Jeng-Tzong Shih, Hsinchu (TW)

(73) Assignee: Etron Technology, Inc., Hsin-Chu (TW)

( * ) Notice: Subject to any disclaimer, the term of this patent is extended or adjusted under 35 U.S.C. 154(b) by 0 days.

(21) Appl. No.: 10/020,755

(22) Filed: Dec. 12, 2001

(51) Int. Cl.⁷ ................................................. H03K 9/08
(52) U.S. Cl. ........................................... 327/34; 327/36
(58) Field of Search ........................... 327/34, 36, 217, 327/379, 551, 552

(56) References Cited

U.S. PATENT DOCUMENTS

| | | | |
|---|---|---|---|
| 5,113,098 A | 5/1992 | Tegmouri | 307/520 |
| 5,563,532 A | 10/1996 | Wu et al. | 327/34 |
| 5,646,565 A * | 7/1997 | Tukidate | 327/34 |
| 6,075,751 A | 6/2000 | Tedrow | 365/233.5 |

* cited by examiner

*Primary Examiner*—Kenneth B. Wells
(74) *Attorney, Agent, or Firm*—George O. Saile; Stephen B. Ackerman; Douglas R. Schnabel (57) ABSTRACT

A minimum pulse width detection and regeneration circuit is achieved. The circuit includes, first, a pulse width detector capable of detecting if an input signal pulse is within a range between a minimum width and a maximum width. Second, a pulse width extender is capable of extending the input signal pulse width to the maximum width if the input signal pulse is in the range. Finally, a glitch filter is capable of filtering out the input signal pulse if the input signal pulse is less than the minimum width.

19 Claims, 6 Drawing Sheets

| FLIP-FLOP STATE: | RESET | OUT |
|---|---|---|
| | DISABLE | LATCH IN |
| | ENABLE | INPUT IN |

CASE: $T_{th} \leq T_w \leq T_{ew}$

MINIMUM PULSE WIDTH DETECTION AND REGENERATION CIRCUIT

BACKGROUND OF THE INVENTION (1) Field of the Invention

The invention relates to an input signal conditioning circuit, and more particularly, to a minimum pulse width detection and regeneration circuit.

(2) Description of the Prior Art

Electronic circuits frequently encounter the problem of small pulse width signals, or glitches. Glitches are often caused at the interface of various integrated circuit components in a system, especially where various components are not synchronized (asynchronous) with a common system clock. Glitches can also occur in synchronized systems due to excessive fan-out, loading, or noise.

Figure 1:
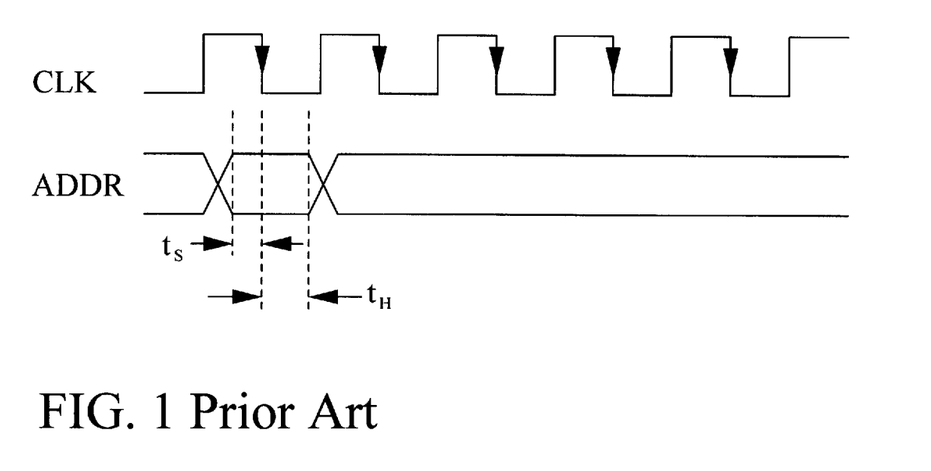
FIG. 1 illustrates a prior art example of an address set up and hold timing for a memory device.

Referring now FIG. 1, a common prior art signal timing diagram is shown. In this diagram, the system clock CLK is represented by a constant periodic signal. An address bus for a memory device ADDR is represented as a sequence of bus states and transitions. To access a location in the memory device, such as a DRAM, for either a read or a write of data, the micro-controller must select the location by forcing the address bus to the desired memory address. As a matter of specification, this address setting must be performed such that a stable address proceeds the clock edge, in this case a falling edge, by a minimum setup time $t_S$. In addition, the address must be stable for a minimum hold time, $t_H$, after the falling edge CLK. The specification of these setup and hold values is used to eliminate internal glitch signals within the memory device and may be specified for addresses, data, and command pins.

Figure 2:
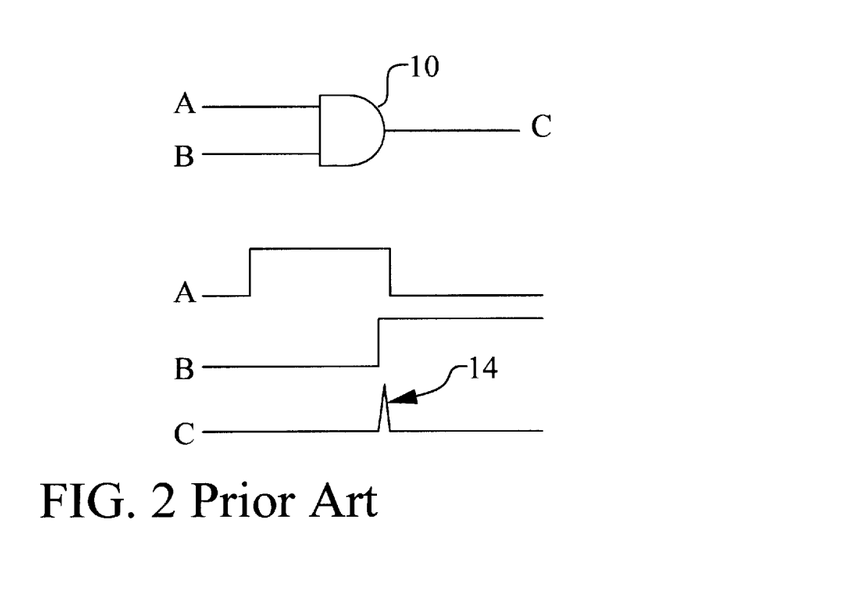
FIG. 2 illustrates a prior art example of how a timing glitch is generated.

The use of setup and hold specifications may not always prevent the creation of glitches due to the above-mentioned problems of fan-out, loading, noise, as well as other problems. Sometimes the design of the system creates asynchronous interfaces that are difficult to design around. Referring now to FIG. 2, a prior art example of the creation of an internal glitch is shown. In this example, an AND gate 10 is used to logically combine the signals A and B to create the signal C. The timing diagram shows a problematic case where the transitions of A and B occur in close proximity. This causes a momentary assertion 14 of C. This glitch 14 may not be intended and, indeed, may not show up during simulation verification due to unaccounted for parasitics or due to device variation. However, the propagation of this glitch 14 may have serious consequences for circuit operation.

Figure 3:
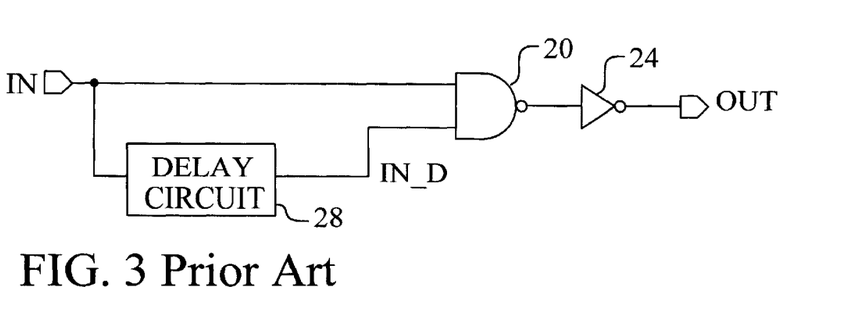
FIG. 3 illustrates a prior art circuit for filtering timing glitches.

Once a short duration pulse or glitch has been introduced into the digital circuit, it can be removed using a filtering circuit. Referring now to FIG. 3, a filtering circuit of the prior art is shown. In this circuit, positive glitches, where the IN signal has a momentary pulse from a low level to a high level and then back to a low level, can be filtered away. Only positive glitches on IN having a length of greater than the propagation delay of the delay element 28 are passed through the NAND gate 20 and the inverter 24 to the output OUT. The key problem with the prior art filter approach is that a new glitch may be generated by the filter itself if the input pulse has a length of slightly greater than the delay element propagation. Therefore, the prior art approach is insufficient to solve the problem.

Figure 4:
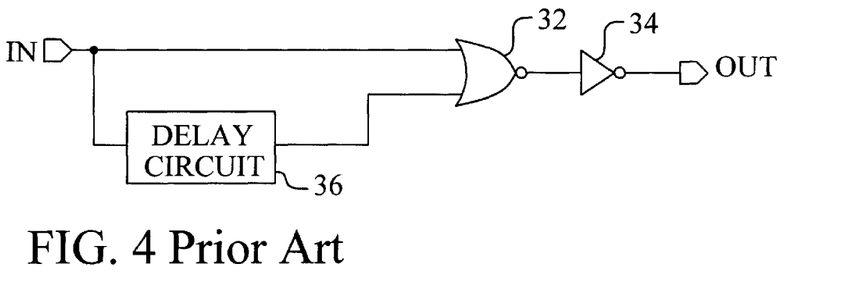
FIG. 4 illustrates a prior art circuit for extending the length of signal pulses.

Referring now to FIG. 4, a glitch lengthening circuit is shown. This circuit uses a delay element 36 and a NOR gate 32 to cause the length of a positive pulse on the input IN to be lengthened by the amount of time introduced by the delay circuit. While this approach may work for some cases, the drawback is that a large, but destructive, glitch may be generated from a small or non-destructive glitch.

Several prior art inventions describe input signal processing and glitch removing circuits. U.S. Pat. No. 6,075,751 to Tedrow describes a circuit to detect and synchronize input signals. The circuit comprises a filter and a pulse generator. U.S. Pat. No. 5,113,098 to Teymouri discloses a glitch removing circuit for a transmission link. A hysteresis input buffer and a filter circuit are used. U.S. Pat. No. 5,563,532 to Wu et al teaches a glitch filter comprising a Schmitt trigger and a series of three active filters.

SUMMARY OF THE INVENTION

A principal object of the present invention is to provide an effective and very manufacturable minimum pulse width detection and regeneration circuit.

A further object of the present invention is to provide a circuit that can detect if a signal pulse width is in the range between a minimum width and a maximum width.

A still further object of the present invention is to provide a circuit that can pass the signal pulse if it exceeds the minimum width and filter out the signal pulse if it is less than the minimum width.

Another still further object of the present invention is to provide a circuit that can extend the pulse width of the signal pulse to the maximum width if the input pulse is in the range.

In accordance with the objects of this invention, a minimum pulse width detection and regeneration circuit is achieved. The circuit comprises, first, a pulse width detector capable of detecting if an input signal pulse is within a range between a minimum width and a maximum width. Second, a pulse width extender is capable of extending the input signal pulse width to the maximum width if the input signal pulse is in the range. Finally, a glitch filter is capable of filtering out the input signal pulse if the input signal pulse is less than the minimum width.

Also in accordance with the objects of this invention, a minimum pulse width detection and regeneration circuit is achieved. The circuit comprises, first, a latch having set, reset, and output. The set is coupled to an input signal. Second, a glitch filter has an input and an output. The input is coupled to the latch output. The input is delayed to create a delayed input. Finally, a delay element has an input and an output. The delay element input is coupled to the glitch filter delayed input. The delay element output is coupled to the latch reset.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a minimum pulse width detection and regeneration circuit of the present invention. This minimum pulse width detection and regeneration circuit is described in three embodiments. It should be clear to those experienced in the art that the present invention can be applied and extended without deviating from the scope of the present invention.

Figure 5:
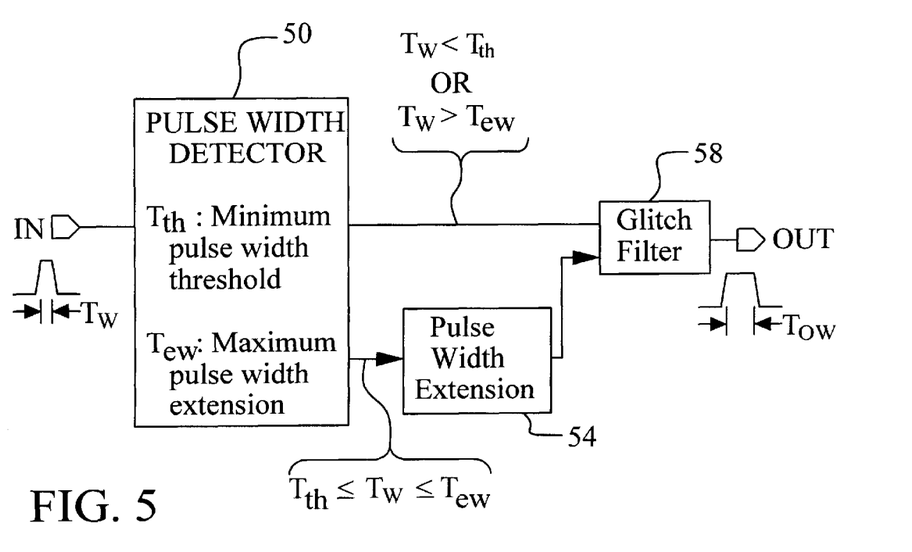
FIG. 5 illustrates a first preferred embodiment of the present invention.

Referring now to FIG. 5, a first preferred embodiment of the present invention is illustrated. Several important features of the present invention are shown. A minimum pulse width detection and regeneration circuit is shown. The circuit comprises, first, a pulse width detector 50 capable of detecting if the width $T_w$ of an input signal pulse IN is within a range between a minimum width $T_{th}$ and a maximum width $T_{ew}$. The input signal IN comprises, for example, a memory address or control signal such as an address line, a data signal, a control signal, a clock signal, or a pulse.

The minimum pulse width threshold $T_{th}$ is defined as the minimum time of a pulse of the input signal IN that will be defined as a valid signal state. If the pulse time $T_w$ is less than $T_{th}$ then glitch filter 58 will filter out the pulse so that the output OUT does not see a transition. The maximum pulse width extension time $T_{ew}$ is defined as the maximum time that the pulse must be extended in length using the pulse width extension circuit 54. Therefore, if the input pulse time $T_w$ is greater than or equal to $T_{th}$ but is less than or equal to $T_{ew}$, then the pulse width will be extended by the pulse width extension circuit 54 and passes through the glitch filter as the output OUT having the output pulse width $T_{ow} = T_{ew}$. If the input pulse width $T_w$ exceeds $T_{ew}$, then it is not necessary to further extend the pulse width.

The pulse width extender 54 is capable of extending the input signal pulse width $T_w$ to the maximum width $T_{ew}$ if the input signal pulse is in the range between $T_{th}$ and $T_{ew}$. The glitch filter 58 is capable of filtering out the input signal pulse if the input signal pulse width $T_w$ is less than the minimum width $T_{th}$.

Note that the pulse width detection 50 is a key feature of the present invention. Unlike the prior art, the present invention distinguishes between input pulses of varying widths $T_w$. Pulse extension or pulse filtering is then selectively performed. In this way, the invention provides a single solution of pulse width detection and correction that eliminates signal glitches over a continuous range of pulse widths. The generation of glitches, by filtering, where the input pulse is slightly greater than the filter delay is eliminated. The generation of glitches, by extension, where the input pulse is very small is eliminated.

Figure 6:
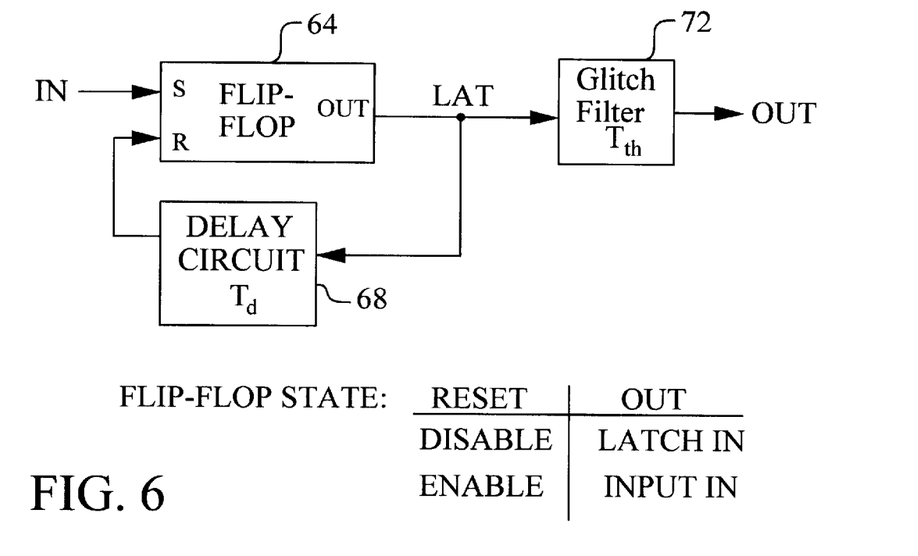
FIG. 6 illustrates a second preferred embodiment of the present invention.

Referring now to FIG. 6, a second preferred embodiment of the present invention is shown. A more specific embodiment of the present invention is shown. Here, the pulse width detector 50 and pulse width extender 54 of FIG. 5 are combined in the function of the flip-flop 64 and the delay circuit 68. The glitch filter 72 is a separate element as was the case in FIG. 5. Referring again to FIG. 6, the combined detector and extender section comprises, first, a latch, or flip-flop, 64 having set, reset, and output. The set is coupled to the input signal IN of the circuit. Second, a delay element 68 has an input and an output. The input of the delay element is coupled to the latch output LAT. The output of the delay element 68 is coupled to the reset of the flip-flop 64. Finally, a glitch filter 72 has an input and an output. The glitch filter input is coupled to the latch output LAT, and the glitch filter output forms the circuit output OUT.

The operation of the flip-flop 64 is summarized in the state table shown in FIG. 6. If the flip-flop reset is enabled, then the output LAT of the flip-flop is simply the input IN. However, if the flip-flop reset is disabled, then the flip-flop 64 latches the input IN level at the output LAT as a positive edge triggered latch.

Figure 7:
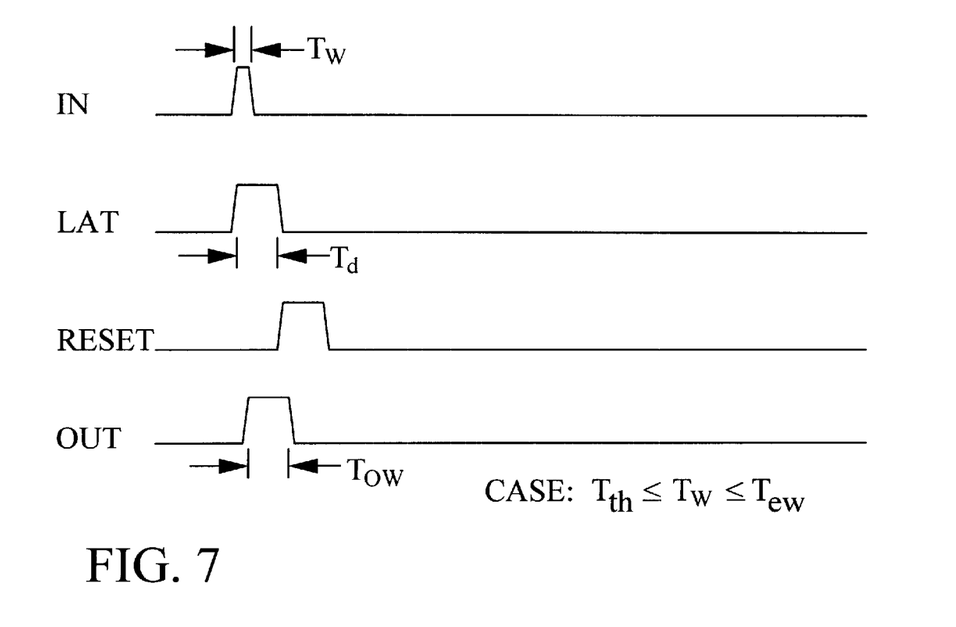
FIGS. 7–9 illustrate the timing performance of the second preferred embodiment of the present invention for the cases of: $T_{th} \leq T_w \leq T_{ew}$, $T_w < T_{th}$, and $T_w > T_{ew}$, respectively.
Figure 8:
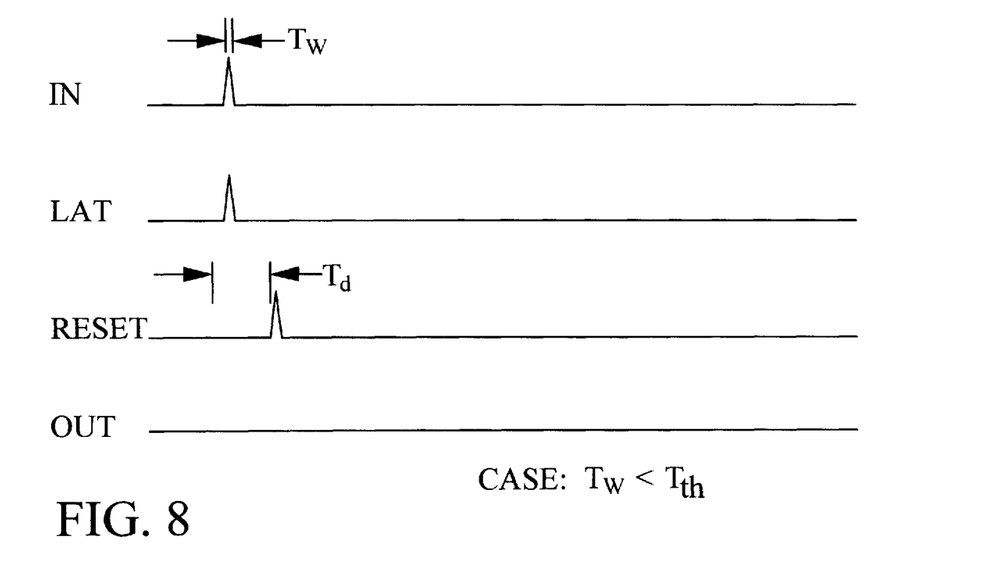
Figure 9:
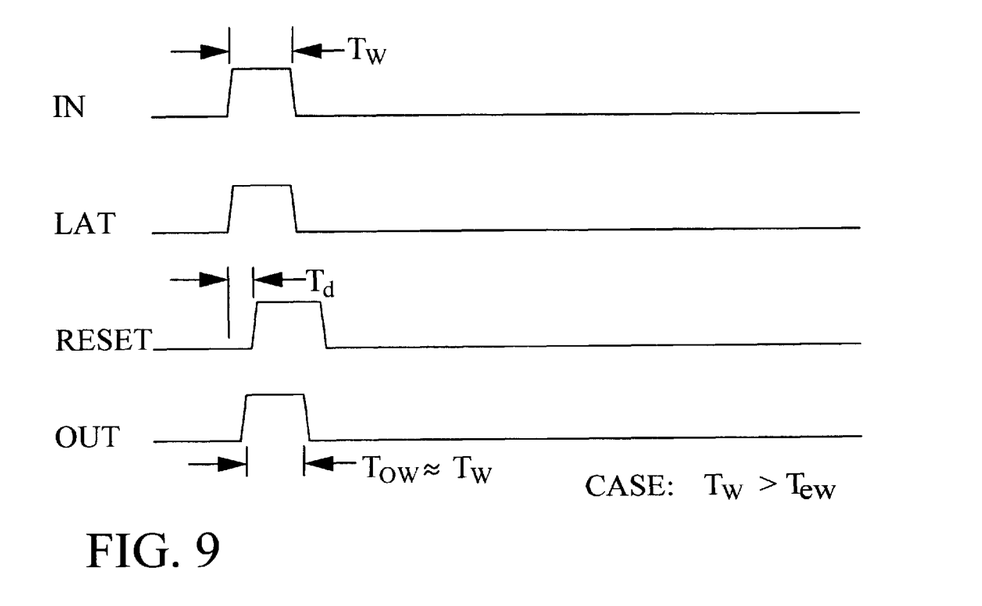

Referring now to FIGS. 7–9, the operation of the detection and regeneration circuit can be more fully understood. Referring particularly to FIG. 7, the case of an input signal IN pulse $T_w$ having a width in the range between the minimum threshold $T_{th}$ and the maximum extension width $T_{ew}$ is shown. The transition of IN from low to high causes the flip-flop 64 output LAT to transition from low to high and become latched in the high state. The LAT signal is processed by the glitch filter 72 which transitions the OUT signal from a low to high after the filter delay $T_{th}$. The delay circuit 68 output RESET transitions from low to high after the delay time $T_d$ transpires. Note that $T_d$ is essentially equal to $T_{ew}$. Once the RESET goes high (disabled), the flip-flop is reset such that the output LAT again tracks the input IN which is now low. The glitch filter 72 then passes the LAT signal to OUT after the filter delay $T_{th}$.

Referring now to FIG. 8, the case of a very small input pulse where $T_w$ is less than the minimum threshold $T_{th}$ is shown. Once again, the LAT signal transitions from a low to a high in response to the input pulse IN. However, since the input pulse width $T_w$ is less than the glitch filter delay $T_{th}$, the output OUT does not change states. The RESET signal still transitions after the delay time $T_d$.

Referring now to FIG. 9, the case of an input IN having a pulse width $T_w$ of greater than the maximum extension width $T_{ew}$ is shown. The IN transition causes the LAT signal to transition. However, the delay time $T_d$ is exceeded. Although the RESET signal is asserted, the LAT signal remains high because the reset only implies that the latch is cleared. The output of the flip-flop 64 equals the input as shown by the state table of FIG. 6. Referring again to FIG. 9, the output of the glitch filter 72 OUT mirrors IN where $T_{ow}$ is about equal to $T_w$ with the offset of the glitch delay $T_{th}$.

Note that the general form of the pulse detection and regeneration circuit of the first embodiment is bipolar in the sense that either positive pulses or negative pulses can be detected and regenerated. However, in the more particular cases of the second and third embodiments, the circuit can detect and regenerate either only negative pulses (from high to low) or only positive pulses (from low to high). The example signals of the second embodiment shown in FIGS. 7–9 illustrate circuit performance for a positive pulse on IN. The performance is easily extended to negative pulses by the proper inversion or non-inversion of the input and output as will be more clearly shown in the third embodiment.

Figure 10:
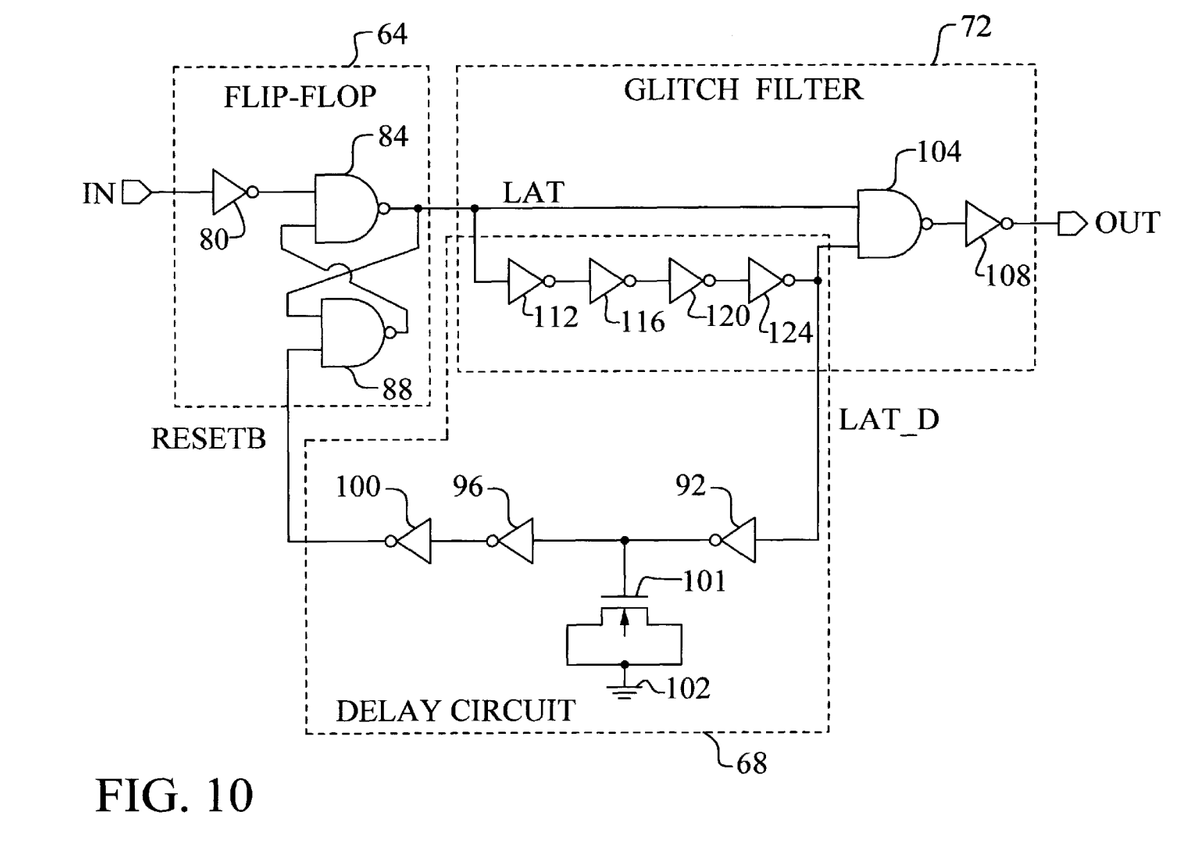
FIG. 10 illustrates the third preferred embodiment of the present invention.

Referring now to FIG. 10, the third embodiment of the present invention is illustrated. This embodiment is an even more particular version of the pulse detection and regeneration circuit of the present invention. The circuit again comprises a flip-flop 64 and delay circuit 68 that combine to provide the pulse detection and extension function. A glitch filter 72 is provided to filter out glitches smaller than $T_{th}$.

The flip-flop, or latch, 64 preferably comprises cross-coupled NAND gates 84 and 88. Alternatively other configurations, such as cross-coupled NOR gates, could be used. In this embodiment, the pulse detection and regeneration circuit is designed for positive pulses. Therefore, the input IN is inverted by the inverter 80. In addition, the output of the glitch filter 72 includes an inverter 108. If the input inverter 80 and the output inverter 108 are removed, the circuit will be useful for detection and regeneration of negative pulses. Note that the reset signal RESETB for the flip-flop 64 is negative asserting in this example. The minimum pulse width threshold $T_{th}$ is determined by the minimum pulse width needed to set the flip-flop 64. This value can be changed by altering device sizes in the flip-flop 64.

The delay circuit comprises a series of sequentially coupled inverters 112, 116, 120, 124, 92, 96, and 100 between the input signal LAT and the output signal RESETB. In this embodiment, part of the delay path for LAT is shared between the delay circuit 68 and the glitch filter 72. In particular, the inverters 112, 116, 120, and 124 between LAT and the delayed latch output LAT_D are shared between the delay circuit 68 and the filter circuit 72. The delay circuit may further comprise a capacitor 101 as shown. The purpose of the capacitor is to provide a large capacitive loading on the output of the first inverter 92 in the delay circuit 68 to thereby create the relatively long delay $T_d$. In this case, the capacitance 101 comprises a MOS device with gate coupled to the signal path and bulk, drain, and source couple to ground 102.

The glitch filter 72 preferably comprises a NAND gate 104 where one input is coupled to the latch output LAT and the other input is coupled to the delayed latch output LAT_D. Since the NAND will only transition to a low value when both inputs are high, the delay $T_{th}$ caused by the inverters between LAT and LAT_D will cause shorter pulses to be filtered out.

Figure 11:
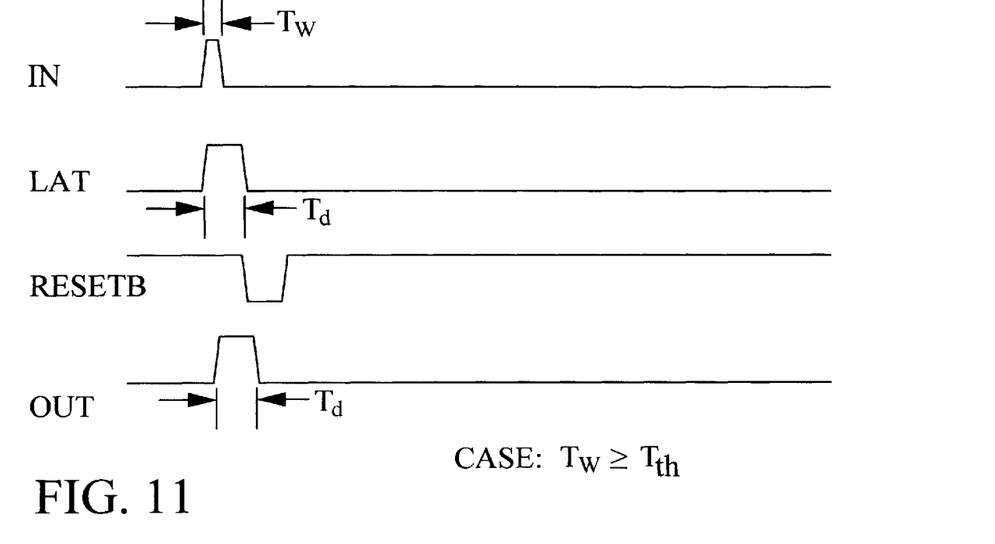
FIGS. 11–12 illustrate the timing performance of the third preferred embodiment of the present invention for the cases of $T_w \geq T_{th}$ and $T_w < T_{th}$, respectively.

Referring now to FIG. 11, the case of an input pulse width $T_w$ of greater than the threshold $T_{th}$ is shown. The input IN passes to the LAT since the RESETB is disabled. After the delay time $T_d$, RESETB is enabled to reset the latch. The OUT signal transmits the IN signal but extends the pulse width to $T_d$.

Figure 12:
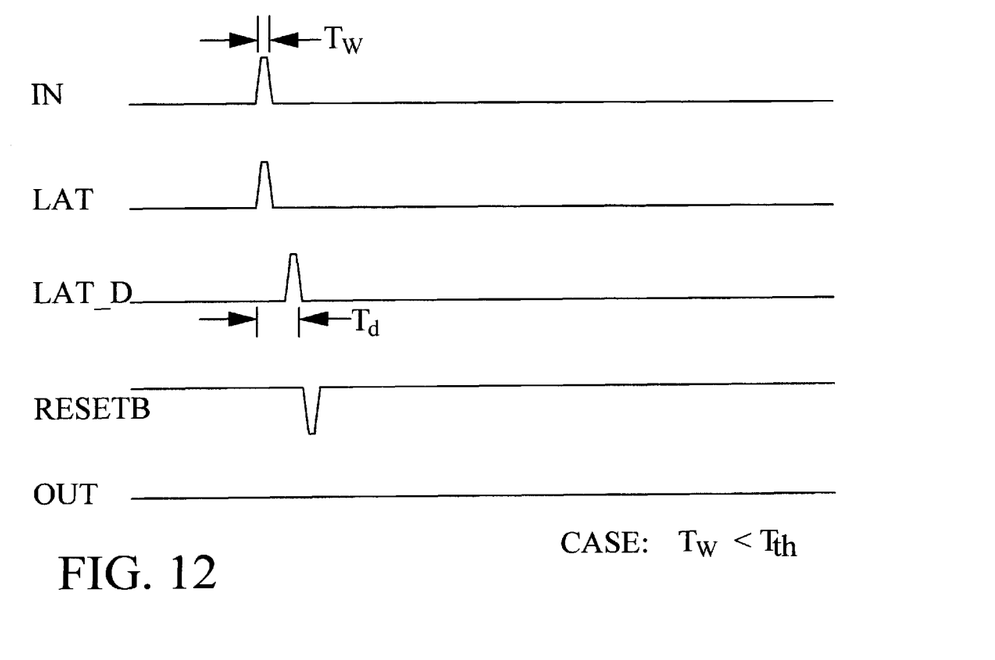

Referring now to FIG. 12, the case of a very small pulse width where $T_w$ is less than $T_{th}$ is shown. The flip-flop cannot be set by the narrow pulse, and the IN transition is passed to LAT. However, since $T_w$ is less than the glitch filter delay $T_{th}$, the output OUT does not transition.

The advantages of the present invention may now be summarized. The present invention provides an effective and very manufacturable minimum pulse width detection and regeneration circuit. A circuit that can detect if a signal pulse width is in the range between a minimum width and a maximum width is provided. The circuit passes the signal pulse if it exceeds the minimum width and filters out the signal pulse if it is less than the minimum width. The circuit can extend the pulse width of the signal pulse to the maximum width if the input pulse is in the range.

As shown in the preferred embodiments, the novel input glitch detection and regeneration circuit provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A minimum pulse width detection and regeneration circuit comprising:
    a pulse width detector capable of detecting if an input signal pulse is within a range between a minimum width and a maximum width;
    a pulse width extender capable of extending said input signal pulse width to said maximum width if said input signal pulse is in said range; and
    a glitch filter capable of filtering out said input signal pulse if said input signal pulse is less than said minimum width wherein said glitch filter comprises:
        a NAND gate having first and second input terminals and an output terminal, wherein said first input terminal is coupled to said input signal; and
        a series of sequentially-coupled inverters having an input terminal and an output terminal, wherein said input terminal is coupled to said input signal and said output terminal is coupled to said NAND gate second input terminal.

2. The circuit according to claim 1 wherein said pulse width detector and said pulse width extender comprise a single circuit further comprising:
    a latch having set, reset, and output terminals, wherein said set terminal is coupled to said input signal; and
    a delay element having input and output terminals, wherein said input terminal is coupled to said latch output terminal and wherein said output terminal is coupled to said latch reset terminal.

3. The circuit according to claim 1 wherein said latch comprises one of the group of: cross-coupled NAND gates and cross-coupled NOR gates.

4. The circuit according to claim 2 wherein said delay element comprises a series of sequentially-coupled inverters.

5. The circuit according to claim 4 wherein said delay element further comprises a delay capacitor.

6. The circuit according to claim 1 wherein said input signal consists of one of the group of: address line, data signal, control signal, clock signal, and pulse signal.

7. A minimum pulse width detection and regeneration circuit comprising:
    a pulse width detector capable of detecting if an input signal pulse is within a range between a minimum width and a maximum width;
    a pulse width extender capable of extending said input signal pulse width to said maximum width if said input signal pulse is in said range wherein said pulse width detector and said pulse width extender comprise a single circuit that further comprises:
        a latch having set, reset, and output terminals, wherein said set terminal is coupled to said input signal; and
        a delay element having input and output terminals, wherein said input terminal is coupled to said latch output terminal and wherein said output terminal is coupled to said latch reset terminal; and
    a glitch filter capable of filtering out said input signal pulse if said input signal pulse is less than said minimum width.

8. The circuit according to claim 7 wherein said latch comprises one of the group of: cross-coupled NAND gates and cross-coupled NOR gates.

9. The circuit according to claim 7 wherein said delay element comprises a series of sequentially-coupled inverters.

10. The circuit according to claim 9 wherein said delay element further comprises a delay capacitor.

11. The circuit according to claim 7 wherein said glitch filter comprises:
   a NAND gate having first and second input terminals and an output terminal, wherein said first input terminal is coupled to said input signal; and
   a series of sequentially-coupled inverters having an input terminal and an output terminal, wherein said input terminal is coupled to said input signal and said output terminal is coupled to said NAND gate second input terminal.

12. The circuit according to claim 7 wherein said input signal consists of one of the group of: address line, data signal, control signal, clock signal, and pulse signal.

13. The circuit according to claim 7 wherein said glitch filter comprises:
   a NAND gate having first and second input terminals and an output terminal, wherein said first input terminal is coupled to said latch output terminal; and
   a series of sequentially-coupled inverters having an input terminal and an output terminal, wherein said input terminal is coupled to said latch output terminal and said output terminal is coupled to said NAND gate second input terminal.

14. A minimum pulse width detection and regeneration circuit comprising:
   a latch having set, reset, and output terminals, wherein said set terminal is coupled to an input signal;
   a glitch filter having an input and an output terminals, wherein said input terminal is coupled to said latch output terminal and wherein said input signal is delayed to create a delayed input; and
   a delay element having input and output terminals, wherein said input terminal is coupled to said glitch filter delayed input signal and wherein said output terminal is coupled to said latch reset terminal.

15. The circuit according to claim 14 wherein said latch comprises one of the group of: cross-coupled NAND gates and cross-coupled NOR gates.

16. The circuit according to claim 14 wherein said delay element comprises a series of sequentially-coupled inverters.

17. The circuit according to claim 16 wherein said delay element further comprises a delay capacitor.

18. The circuit according to claim 14 wherein said minimum pulse width comprises a negative pulse.

19. The circuit according to claim 14 wherein said minimum pulse width comprises a positive pulse.

* * * * *